United States Patent [19]

Sharma et al.

[11] Patent Number: 5,498,560
[45] Date of Patent: Mar. 12, 1996

[54] PROCESS FOR FORMING AN ELECTRICALLY PROGRAMMABLE READ-ONLY MEMORY CELL

[75] Inventors: Umesh Sharma; Michael P. Woo, both of Austin, Tex.

[73] Assignee: Motorola, Inc., Schaumburg, Ill.

[21] Appl. No.: 311,162

[22] Filed: Sep. 16, 1994

[51] Int. Cl.⁶ .................................................. H01L 21/8247
[52] U.S. Cl. ................. 437/43; 437/44; 437/191
[58] Field of Search .................. 437/43, 44, 50, 437/195, 191

[56] References Cited

U.S. PATENT DOCUMENTS

| | | | |
|---|---|---|---|
| 4,618,876 | 10/1986 | Stewart et al. | 357/54 |
| 4,997,781 | 3/1991 | Tigelaar | 437/43 |
| 5,064,683 | 11/1991 | Poon et al. | 427/39 |
| 5,194,925 | 3/1993 | Ajika et al. | 257/314 |
| 5,196,722 | 3/1993 | Bergendahl et al. | 257/304 |
| 5,302,844 | 4/1994 | Mizuno et al. | 257/396 |
| 5,382,540 | 1/1995 | Sharma et al. | 437/43 |
| 5,434,093 | 7/1995 | Chau et al. | 437/44 |

FOREIGN PATENT DOCUMENTS 3-34577  2/1991  Japan .

OTHER PUBLICATIONS

Shum et al., U.S. appl. No. 08/222,044 filed on Apr. 4, 1994.
Roth et al., U.S. appl. No. 08/296,908 filed on Aug. 29, 1994.

*Primary Examiner*—Chandra Chaudhari
*Attorney, Agent, or Firm*—George R. Meyer

[57] ABSTRACT

EPROM cells include T-shaped floating gates (61, 171) and control gates that surround virtually all of the floating gates (61, 171) except for the portion of the floating gates (61, 171) that lie on a gate dielectric layer (51, 151). The EPROM cells may include customized well regions (22, 122) to allow flash erasing or individual cell erasing for electrically erasable EPROMs. Many different configurations of the memory cells are possible. The configurations of the source regions, drain regions, and well regions (22, 122) may be determined by how a user of the memory cells wants to program or erase the memory cells.

22 Claims, 8 Drawing Sheets

PROCESS FOR FORMING AN ELECTRICALLY PROGRAMMABLE READ-ONLY MEMORY CELL

FIELD OF THE INVENTION

The present invention relates to semiconductor devices, and in particular, to electrically programmable read-only memory cells.

BACKGROUND OF THE INVENTION

Conventional electrically programmable read-only memory (EPROM) cells typically have control gate members that overlie the top or the top and sides of floating gates. When a control gate member overlies only the top of the floating gate, the capacitive coupling between a floating gate and control gate member typically does not exceed about 50%. When a control gate member lies adjacent to the top and sides of the floating gate, the capacitive coupling between a floating gate and control gate member may increase to about 70%. To reduce programming and erasing voltages, a higher capacitive coupling is required. This feature makes the device more suitable for low voltage nonvolatile memory applications.

An attempt to further increase capacitive coupling may include the use of multiple layers to form a control gate that lies adjacent to the top, sides, and part of the bottom of the control gate layer. Two depositing and two patterning steps may be required just to form the control gate. Further, the intergate dielectric layer (between the control gate member and the floating gate) may include two distinct regions and require three steps to be formed. For example, one region of the intergate dielectric layer may have one thickness between the bottom of the floating gate and an underlying portion of the control gate member, and the other region of the intergate dielectric layer may have a different thickness between the top of the floating gate and an overlying portion of the control gate member. Extra processing steps typically lower yield, increase cycle time, and are generally undesired.

SUMMARY OF THE INVENTION

The present invention includes an electrically programmable read-only memory cell comprising: a semiconductor substrate; a floating gate overlying the substrate; an intergate dielectric layer lying adjacent to the floating gate; and a control gate lying adjacent to the intergate dielectric layer. The floating gate has a T-shape. The intergate dielectric layer has a uniform thickness adjacent to the floating gate. A portion of the control gate underlies a portion of the floating gate. The present invention also includes a process for forming the memory cell.

The present invention also includes a semiconductor device including a first plurality of electrically programmable read-only memory cells comprising a semiconductor substrate, a first well region, a second well region, floating gates, an intergate dielectric layer, and word lines. The semiconductor substrate has a first conductivity type. The first well region has a second conductivity type that is opposite the first conductivity type. The first well region lies within the substrate and is associated with a second plurality of the memory cells. The second well region has the first conductivity type and lies within the first well region. The second well region is associated with a third plurality of the memory cells. The floating gates overlie the second well region, and the intergate dielectric layer lies adjacent to the floating gates. The word lines lie adjacent to the intergate dielectric layer. The present invention also includes a process for forming the semiconductor device.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE DRAWINGS

EPROM cells include T-shaped floating gates and control gates that surround virtually all of the float gates except for the portions of the floating gates that lie on a gate dielectric layer. In some embodiments, a portion of the control gate may also act as the select gate for the memory cell. The EPROM cells may include customized well regions to allow flash erasing or individual cell erasing for electrically erasable EPROMs. The present invention is better understood after reading the descriptions of the embodiments that follow.

Before progressing further, terminology needs to be understood. EPROM cells are capable of being electrically programmed. EPROM cells may or may not be capable of being electrically erased. Electrically erasable and electrically programmable read-only memory (EEPROM) cells are a specific type of EPROM cells. Flash EEPROM cells are specific types of both EPROM and EEPROM cells. Flash EEPROM cells are configured, such that a plurality of the cells may be erased during a single erasing operation. In many devices, a row of memory cells, a column of memory cells, or even the entire memory array may be erased during the same erasing operation. EEPROM cells that are not flash EEPROMs are referred to in this specification as individually erasable EEPROM cells or IEEPROMs.

Either a single layer or a composite of layers may be used for a dielectric layer. The thickness of a dielectric layer may be expressed as an electrically measured oxide equivalent thickness, which is generally determined by measuring the capacitance of a capacitor of known area. Using the permittivity of silicon dioxide, a thickness of the layer may be calculated from the capacitance measured. In other words, if a composite layer, such as oxide-nitride-oxide (ONO), has an electrically measured oxide equivalent thickness of 100 angstroms, the composite layer may be replaced by a single layer of silicon dioxide that is 100 angstroms thick and still give the same capacitance. Those skilled in the art are familiar with electrically measured oxide equivalent thicknesses.

Flash EEPROM

Figure 1:
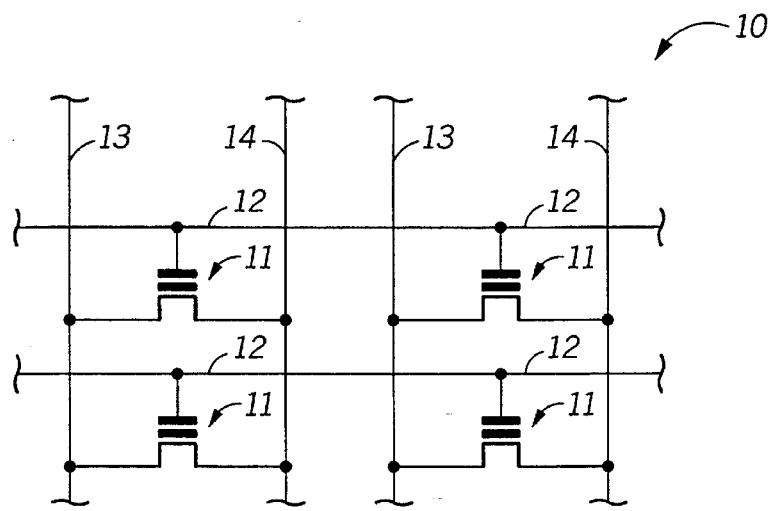
FIG. 1 includes an illustration of a circuit diagram of a portion of a memory array.

FIG. 1 includes an illustration of a circuit diagram of a portion of a flash EEPROM memory array 10. Included within the memory array 10 are four memory cells 11. In reality, there are more memory cells than are shown but are not included for simplicity. Each memory cell 11 is connected to a source bit line 13 and a drain bit line 14. The control gates are connected to word lines 12. Note that the memory array 10 has dedicated source and drain bit lines 13 and 14. By dedicated, it is meant that each bit line is electrically connected to one row or column of memory cells, but is not electrically connected to any other row or column of memory cells. Compare this with a conventional memory array in which a source bit line or a drain bit line may be shared by a plurality of rows or columns of memory cells.

Figure 2:
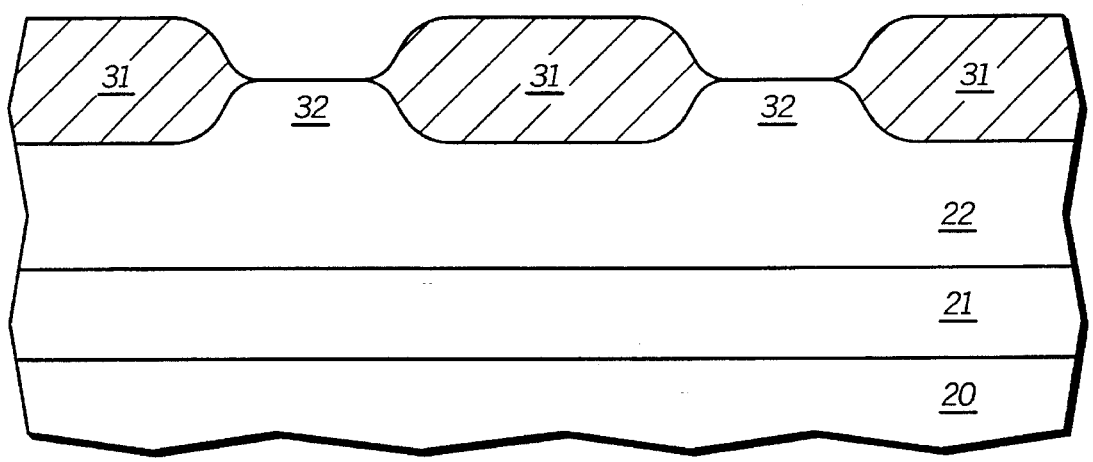
FIG. 2 includes an illustration of a cross-sectional view of a portion of a semiconductor substrate after forming field isolation regions.

FIG. 2 includes an illustration of a cross-sectional view of a portion of a p-type semiconductor substrate 20. Within the substrate 20, an n-well region 21 underlies the entire memory array, and a p-well region 22 also underlies the entire memory array. In alternate embodiments, some of the memory cells 11 may overlie the n-well region 21 or the p-well region 22. In any event, the number of memory cells overlying the substrate is no less than the number of memory cells overlying the n-well region 21, and the number of memory cells overlying the n-well region 21 is no less than the number of memory cells overlying the p-well region 22. In this particular semiconductor device, all of the memory cells are common to the substrate 20, n-well region 21, and p-well region 22 because a flash EEPROM array is being formed.

Figure 3:
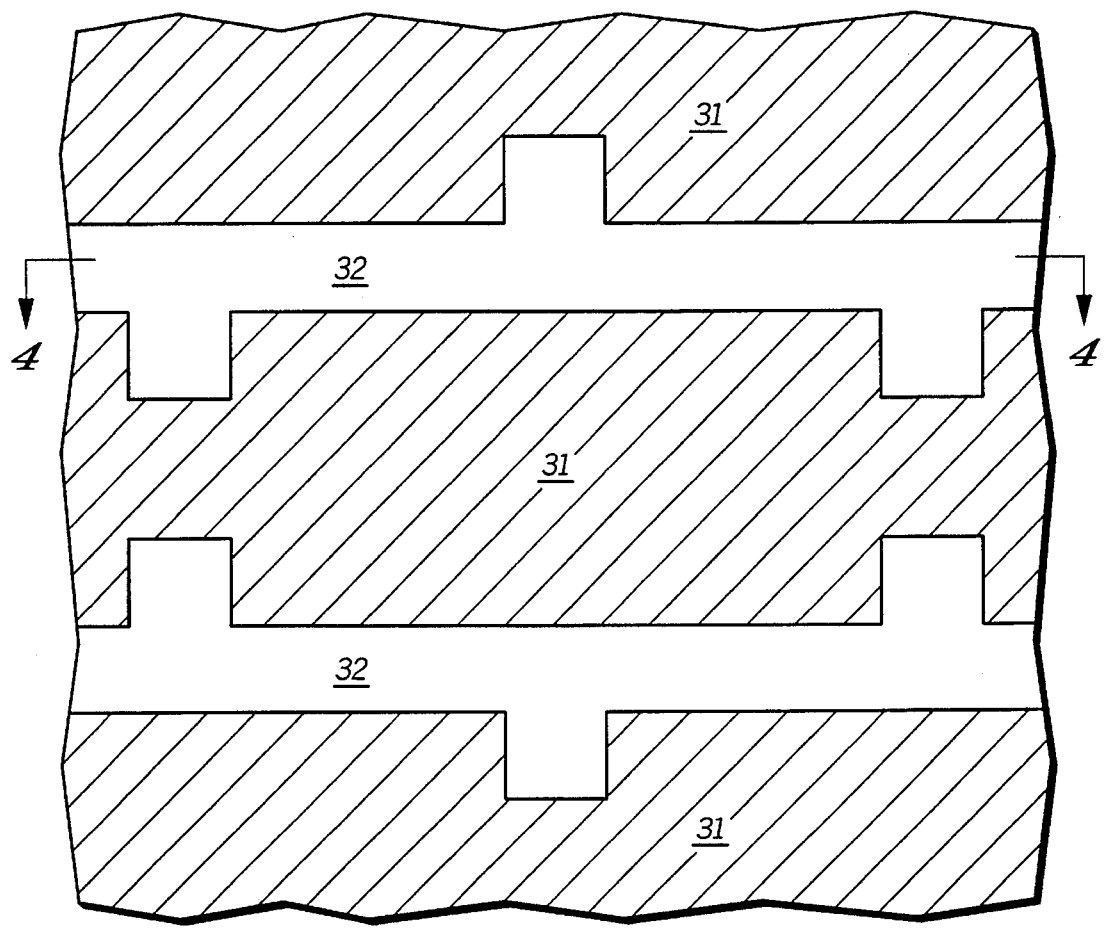
FIG. 3 includes an illustration of a plan view of the substrate of FIG. 2.

Field isolation regions 31 are formed from a portion of the p-well region 22. The portions of the p-well region 22 that lie between the field isolation regions 31 define active regions 32. FIG. 3 includes an illustration of a plan view of the memory array at this point in processing. The active regions 32 have lengths that generally extend from side to side of FIG. 3.

Figure 4:
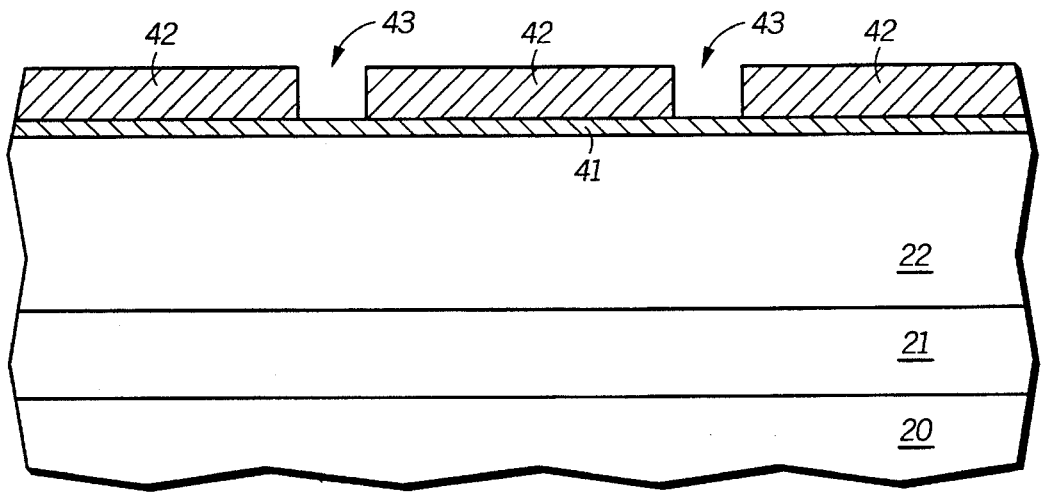
FIG. 4 includes an illustration of a cross-sectional view of the substrate of FIG. 3 after forming two layers and openings extending through one of the layers.

An oxide layer 41 and a nitride layer 42 are formed over the p-well region 22 as shown in FIG. 4. FIG. 4 is a cross-sectional view of a portion of FIG. 3 as shown by the sectioning lines in FIG. 3. Note that FIG. 2 is a cross-sectional view that lies along a plane substantially perpendicular to the plane of FIG. 4. The oxide layer 41 may be formed by thermal oxidation or by depositing a silicon dioxide layer. The thickness of the oxide layer is typically in a range of about 50–500 angstroms. The nitride layer 42 is formed by depositing silicon nitride to a thickness of about 1000–2000 angstroms. The silicon nitride layer 42 is patterned to form openings 43 where floating gates are subsequently formed. The openings 43 typically have a width and range of 0.25–1.0 micron.

Figure 5:
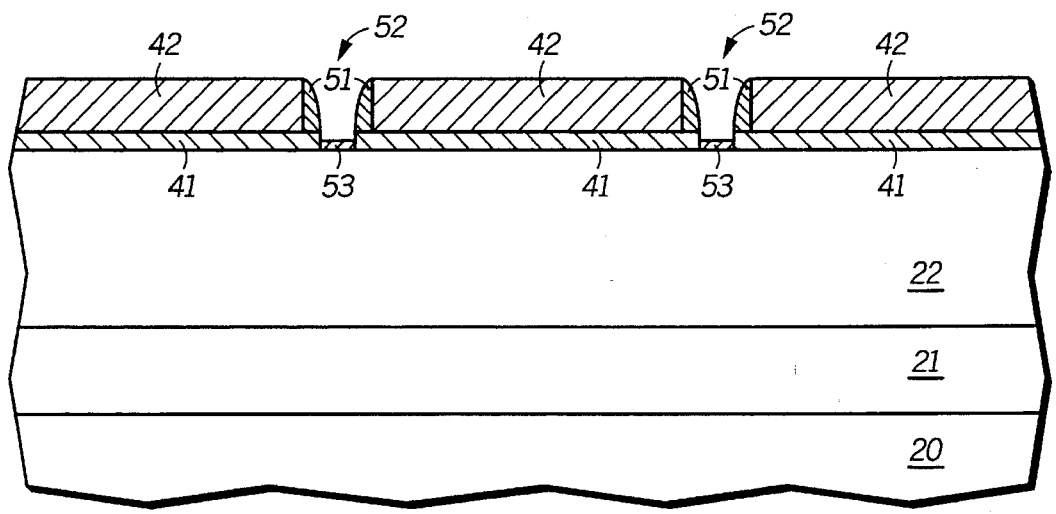
FIG. 5 includes an illustration of a cross-sectional view of the substrate of FIG. 4 after forming spacers and a gate dielectric layer.

Silicon nitride spacers 51 are formed within the openings 43 (not identified in FIG. 5) to form floating gate openings 52 as shown in FIG. 5. The spacers 51 are formed by depositing a silicon nitride layer to a thickness in a range of 1000–2000 angstroms thick and anisotropically etching the silicon nitride layer to form the spacers 51. At the base of the spacers 51 the openings 52 have a width of about 0.3 micron or narrower. The openings 52 are formed such that they are narrower than the openings 43. In any event, the openings 52 may be formed to a sublithographic width. Although the spacers 51 include silicon nitride, the thickness of the silicon nitride layer 42 is sufficiently thick so that during the formation of the spacers 51, some of the silicon nitride may be etched away but there is still a substantial thickness left to allow the proper formation of the subsequently formed floating gates. After forming the spacers 51, exposed portions of the oxide layer 41 are removed, and a gate dielectric layer 53 is formed. Because a flash EEPROM is being formed in this embodiment, the gate dielectric layer 53 is a tunnel dielectric layer, which is a specific type of gate dielectric layer. For this embodiment, the thickness of the gate dielectric layer 53 has a thickness and a range of 50–150 angstroms. The gate dielectric layer includes silicon dioxide, silicon nitride, or a nitrided oxide.

Figure 6:
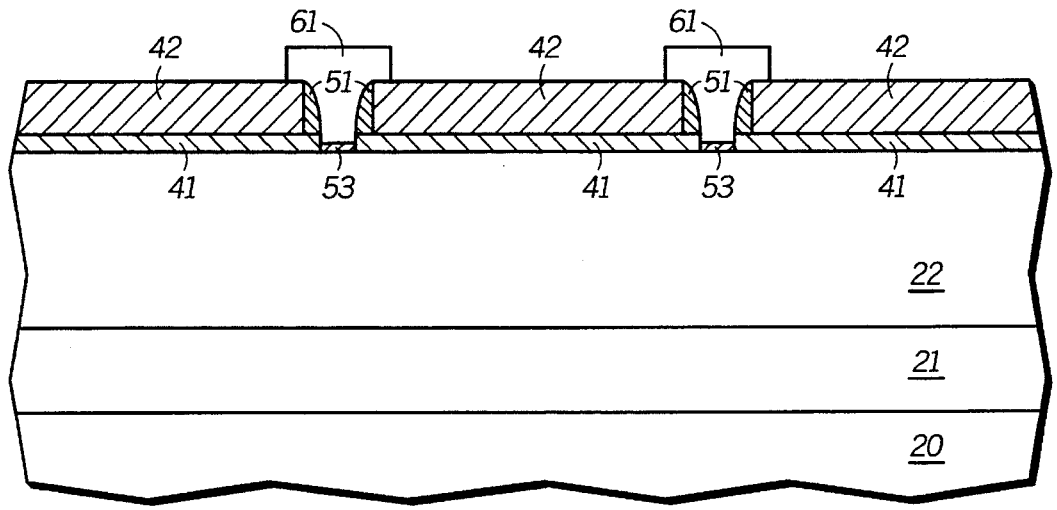
FIG. 6 includes an illustration of a cross-sectional view of the substrate of FIG. 5 after forming floating gates.

Floating gates 61 are formed within the openings as shown in FIG. 6. The floating gates 61 are formed by depositing a silicon or metal-containing layer and then patterning the layer using known lithographic techniques. The thickness of the silicon or metal-containing layer is typically about 1000–3000 angstroms. The width of the floating gates 61 at the top of the floating gates 61 are about 0.5–1.0 micron. Each of the floating gates 61 has a T-shape.

Figure 7:
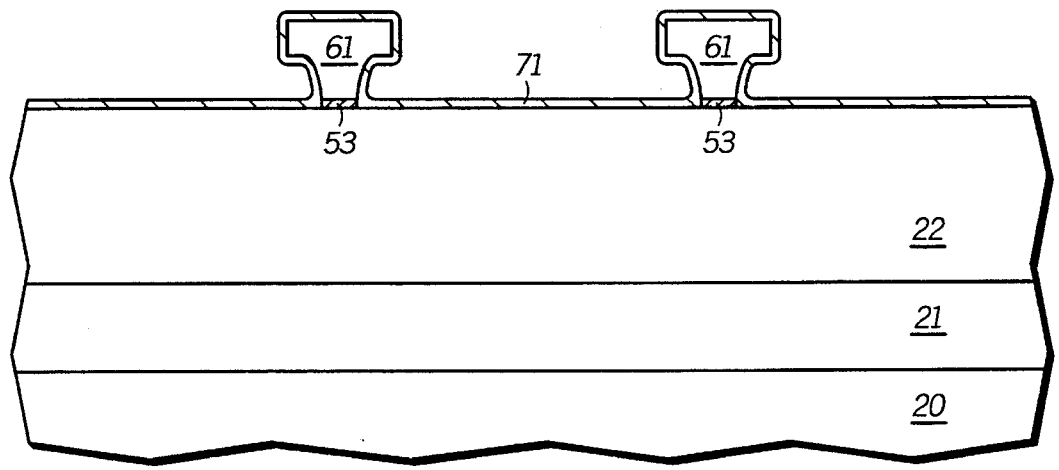
FIG. 7 includes an illustration of a cross-sectional view of the substrate of FIG. 6 after forming an intergate dielectric layer.

After forming the floating gates 61, the nitride layer 42 and oxide layer 41 are removed. An intergate dielectric layer 71 is then formed over the p-well region 22 and the floating gates 61 as shown in FIG. 7. The intergate dielectric layer 71 may include silicon dioxide, silicon nitride, nitrided oxide, or may even include an ONO composite. The intergate dielectric layer 71 has an electrically measured oxide equivalent thickness in a range of 50–300 angstroms. The intergate dielectric layer 71 has a uniform thickness adjacent to sides and tops of the floating gates 61.

Figure 8:
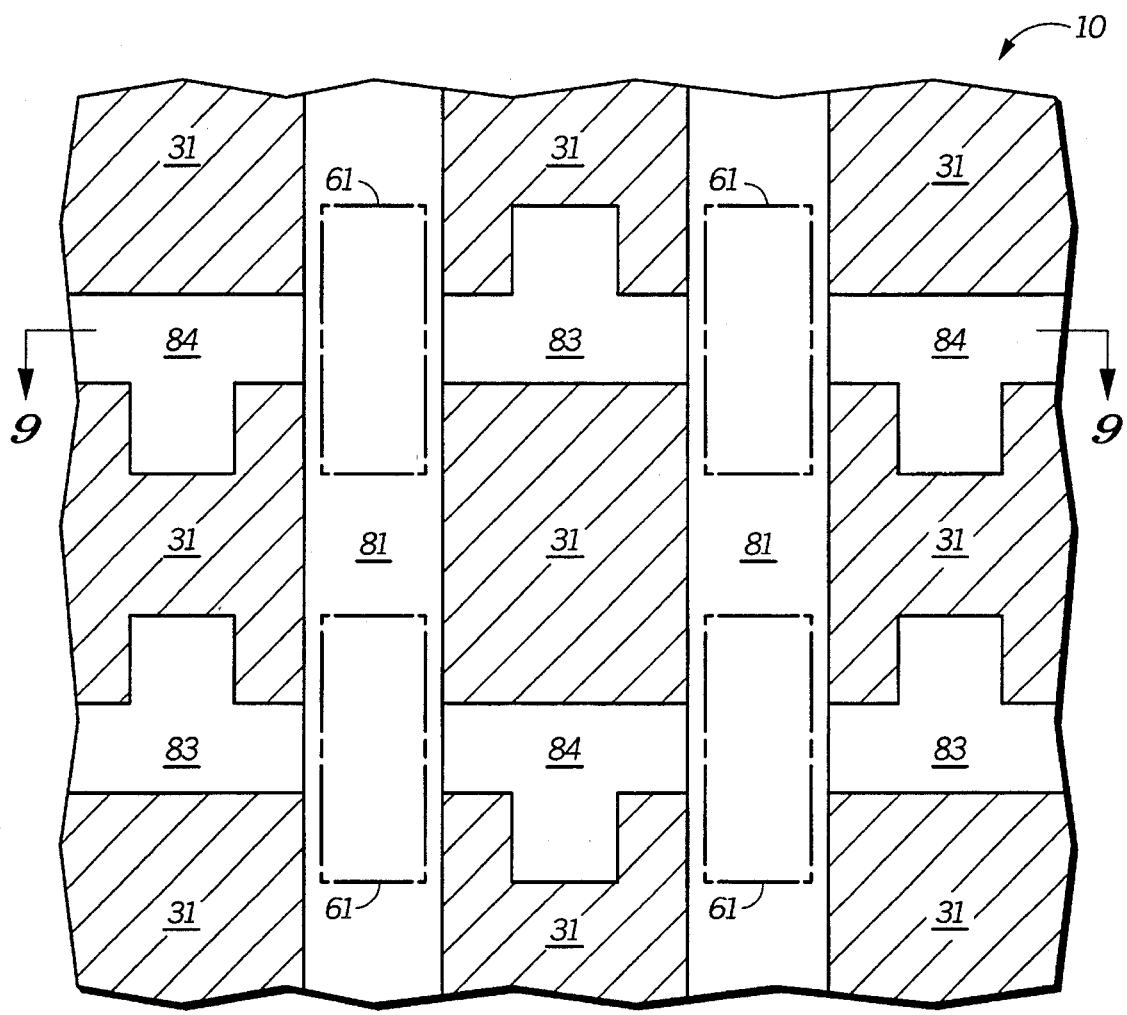
FIGS. 8 and 9 include illustrations of plan and cross-sectional views, respectively, of the substrate of FIG. 7 after forming word lines.
Figure 9:
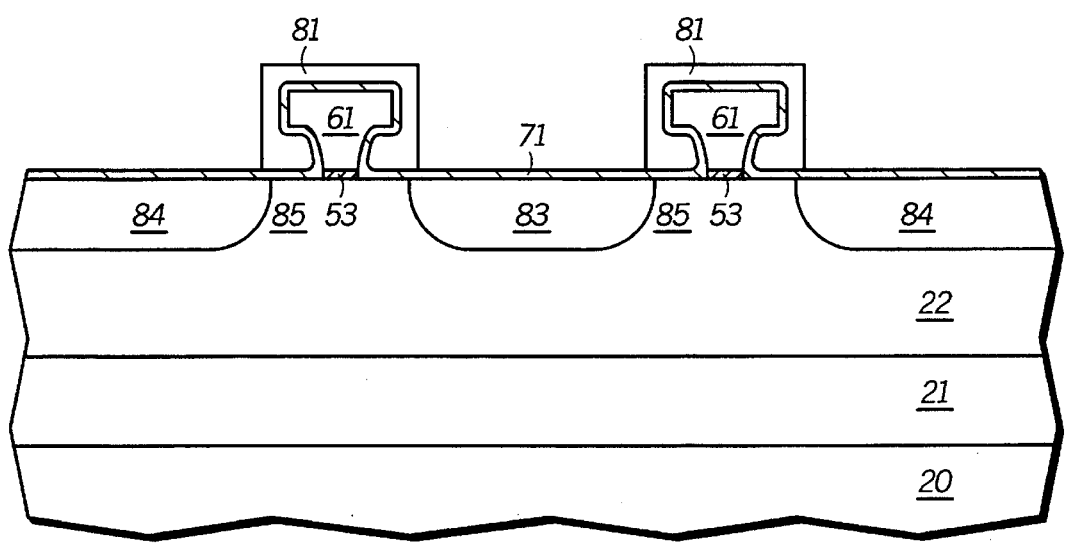

Word lines 81, source regions 83, and drain regions 84 are formed as shown in FIGS. 8 and 9. FIG. 8 includes an illustration of a plan view of the memory array 10. The word lines 81 are formed by depositing a silicon or metal-containing layer to a thickness in a range of 1000–3000 angstroms and then patterning the layer. The word lines 81 have lengths that extend from top to bottom as shown in FIG. 8. The portion of the floating gates 61 that underlie the word lines are shown by a line-dash-line designation in FIG. 8. The portion of the word lines 81 that lie adjacent to the floating gates 61 form the control gates for the memory cells. Therefore, each word line 81 in FIG. 8 has two control gates illustrated. Note that the word lines 81 extend beyond that shown in FIG. 8 and may be connected to an entire column of memory cells. After forming the word lines 81, the portions of the active regions that are exposed adjacent to the word lines 81 are doped to form source regions 83 and drain regions 84 as shown in FIGS. 8 and 9.

FIG. 9 is a cross-sectional view of the plan view of FIG. 8 at the sectioning lines 9—9 as shown in FIG. 8. The source and drain regions 83 and 84 underlie a portion of the word lines 81 but do not underlie any portion of the gate dielectric layer 53. Therefore, the portions of the word lines 81 that overlie the floating gates 61 are merged select/control gates for those memory cells. In other words, those portions of the word lines 81 that overlie the floating gates 61 act as both select gates and control gates. The portions of the p-well region 22 that lie between the source and drain regions 83 and 84 define the channel regions 85 as shown in FIG. 9.

Figure 10:
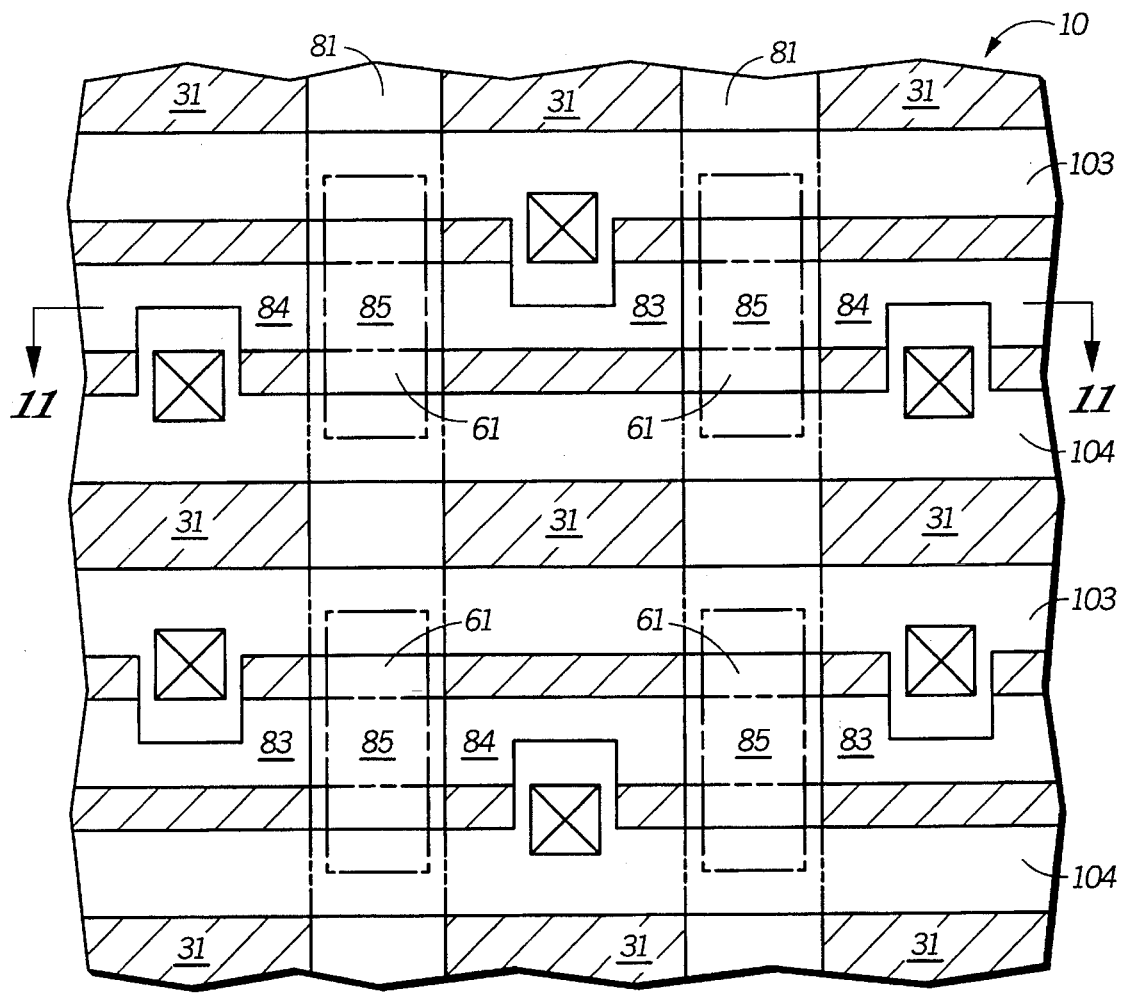
FIGS. 10 and 11 include illustrations of plan and cross-sectional views, respectively, of the substrate of FIGS. 8 and 9 after forming a substantially completed device.
Figure 11:
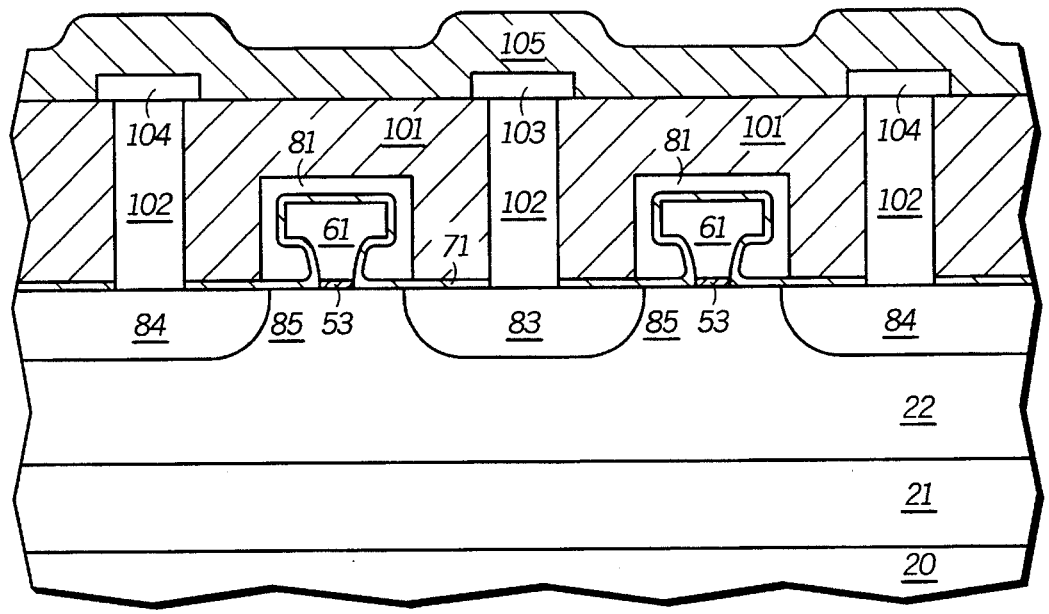

The device is further processed to form a substantially completed device as shown in FIGS. 10 and 11. An insulating layer 101 is formed over the entire substrate 20 including the word lines 81. After forming the insulating layer 101, contact openings are made that extend to the source regions 83 and drain regions 84 as well as the word lines 81. Contacts to the word lines 81 are not shown in FIG. 10 or 11. After forming the contact openings, contact plugs 102 are formed to fill the contact openings. After forming the contact plugs 102, interconnects are formed including the source bit lines 103 and drain bit lines 104. After forming the interconnects, a passivation layer 105 is formed over the interconnects and insulating layer 101.

FIG. 10 includes an illustration of a plan view of the memory array 10 at this point in the processing. The source bit lines 103 and drain bit lines 104 have lengths that extend from side to side in FIG. 10 and are generally perpendicular to the lengths of the word lines 81. X's within the squares of the bit lines 103 and 104 in FIG. 10 illustrate where electrical contacts are made to underlying source and drain regions 83 and 84. FIG. 11 is an illustration of a cross section at the sectioning lines 11—11 as shown in FIG. 10. Other additional insulating layers, via plugs, and interconnecting levels may be required but are not illustrated in FIGS. 10 and 11.

The memory cells may be programmed and erased by Fowler-Nordheim tunneling. To program a memory cell, its source region 83, its drain region 84, and the p-well region 22 are all at about zero volts. The word line 81 for the memory cell is typically placed at a potential in a range of 10–20 volts. The memory cells 11 within the memory array 10 may be erased by having the source regions 83, drain regions 84, and p-well region 22 at a potential of about 10–20 volts and having the word lines 81 at a potential of about zero volts. The entire memory array 10 will be erased if all word lines are at a potential of about zero volts. A column of memory cells 11 may be erased at a time. More specifically, the memory cells 11 along one word line 81 to be erased may have their word line 81 at about zero volts while the other word lines are at a potential of about 10–20 volts. A user has an option of erasing part of all of a memory array at a time.

In an alternate embodiment, the memory cells 11 may be erased by having the source regions 83, drain regions 84, and p-well region 22 at a potential of about zero volts and having the word lines 81 at a potential of about –10 to –20 volts. To read a memory cell, its source region 83 and p-well region 22 are at a potential of about zero volts, and its word line 81 is at a potential and a range of 3–5 volts (and is typically connected to a $V_{DD}$ electrode of the device). The memory cell's drain region 84 is connected to a sense amplifier that determines whether or not the memory cell has been programmed.

IEEPROM

Some users of the semiconductor device may require that the memory cells be individually erasable instead of flash erasable. IEEPROMs may be formed using a plurality of p-well regions or graded drain junctions as are described in more detail below.

Figure 12:
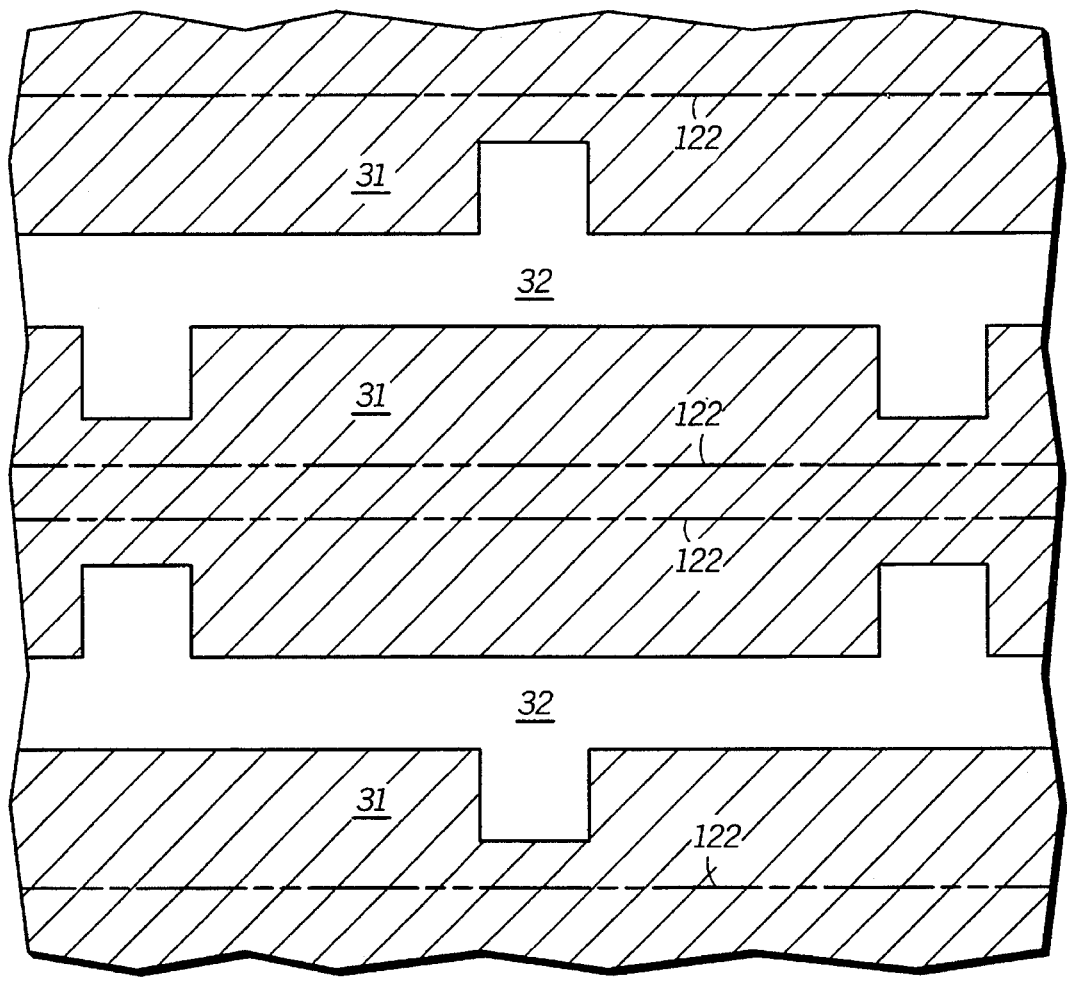
FIG. 12 includes an illustration of a plan view of a portion of a semiconductor substrate after forming field isolation regions and p-well regions.

FIG. 12 includes an illustration of a plan view of a portion of a memory array at a point in processing after the field isolation regions 31 have been formed. Note that FIG. 12 is similar to FIG. 3. Unlike FIG. 3, FIG. 12 does not have a single p-well region but has a plurality of p-well regions 122 that are formed in strips whose lengths generally extend from side to side of FIG. 12. The edges of the p-well regions 122 are shown by a line-dash-dash-line designation. Each active region 32 lies within one of the p-well regions 122. Portions of the field isolation regions 31 lie between the p-well regions 122 and lie directly on the n-well region 21 (not shown in FIG. 12). After forming the field isolation regions 31, the device is further processed similar to the flash EEPROM embodiment. See FIGS. 10 and 11. Note that device is formed such that the lengths of the p-well regions 122 in FIG. 12 will be perpendicular to the lengths of the word lines 81 (not shown in FIG. 12).

The memory cells may be programmed, erased, and read as described below. Programming a memory cell of this embodiment is the same as the flash EEPROM embodiments except that its p-well region 122 is at a potential of about zero volts. To erase the memory cell, its source region 83, its drain region 144, and its p-well regions 122 are at a potential of about 10–20 volts, and its word line 81 is at a potential of about zero volts. The other memory cells that lie along that p-well region 122 may have their word lines 81 at a potential of about 10–20 volts to prevent them from being erased. Unlike the flash EEPROM embodiment, memory cells of this embodiment may be erased individually because the lengths of the well regions 122 are perpendicular to the length of the word lines. Other p-well regions 122 may have their potential at about zero volts during the erase operation. The reading of the memory cell is performed substantially the same as in the flash EEPROM embodiment.

Figure 13:
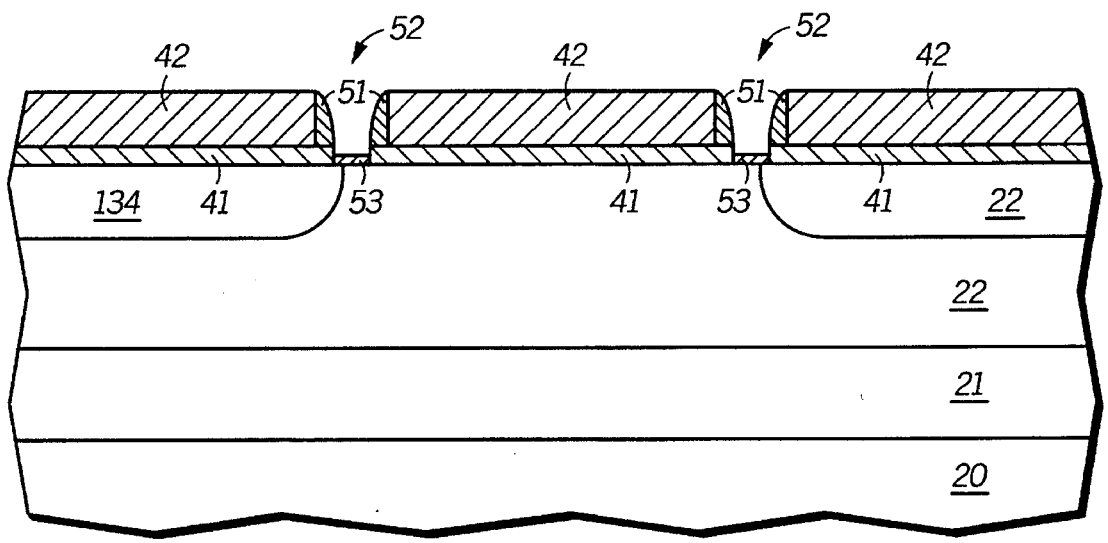
FIG. 13 includes an illustration of a cross-sectional view of a portion of a semiconductor substrate after forming doped regions and layers including a gate dielectric layer.

In another IEEPROM embodiment, graded drain junctions may be formed. In this manner, a plurality of p-well regions are not required and may form a smaller memory array. Referring to FIG. 13, an oxide layer 41 is formed as previously described in flash EEPROM embodiment. A masking layer (not shown) is formed over the oxide layer 41. The substrate is then ion implanted to form doped regions 134. The dopant concentration of the doped regions 134 is in a range of about 1E15 to 1E18 atoms per cubic centimeter. The nitride layer 42, spacers 51, openings 52, and gate dielectric layer 53 are formed after forming the doped regions 134 and are similar to their corresponding layers or openings as described in the flash EEPROM embodiment.

Figure 14:
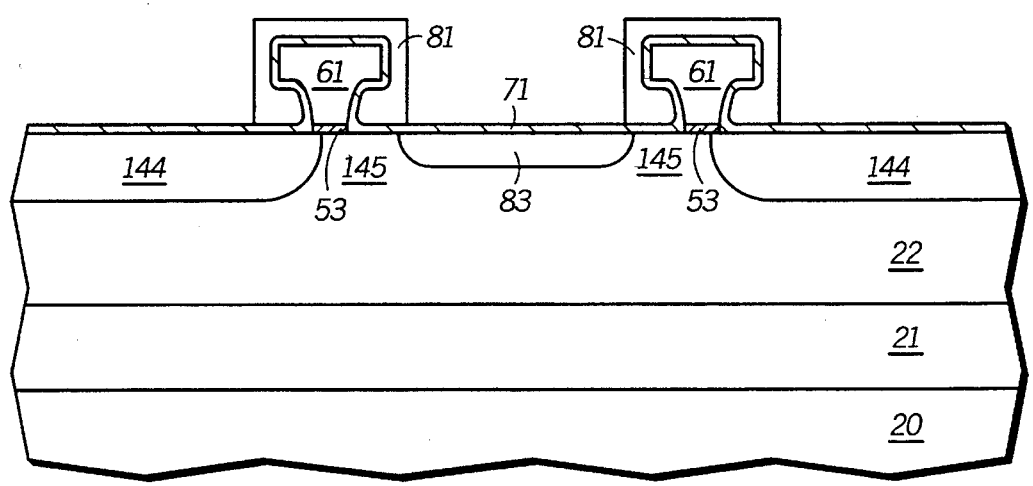
FIG. 14 includes an illustration of a cross-sectional view of the substrate of FIG. 13 after forming an intergate dielectric layer and word lines.

The floating gates 61 are formed as described previously followed by the removal of the layers 41 and 42 and spacers 51. The intergate dielectric layer 71 and word lines 81 are then formed as shown in FIG. 14. Following the formation of the word lines 81, the substrate is doped to form the source region 83 and graded drain regions 144. The graded drain regions 144 are essentially combinations of the drain regions 84 of the flash EEPROM embodiment and the doped regions 134 (as seen in FIG. 13). The doped regions 134 are deeper and have a lighter doping concentrations near the p-well region 22 compared to the source region 83. Channel regions 145 lie between the source region 83 and graded drain regions 144. The substrate is then processed substantially similar to the previous embodiment to form the IEEPROM cells.

The memory cells may be programmed and read similar to the flash EEPROM embodiment described above. To erase the memory cell, its source region 83 and the p-well region 22 are at a potential of about zero volts, its graded drain region 144 is at a potential of about 5 volts, and its word line 81 is at a potential of about −9 to −10 volts. During erasing, the difference in potential between the memory cell's graded drain region 144 and the word line 81 should be in a range of about 10–20 volts.

Floating Gate Formed by Chemical-Mechanical Polishing

Figure 15:
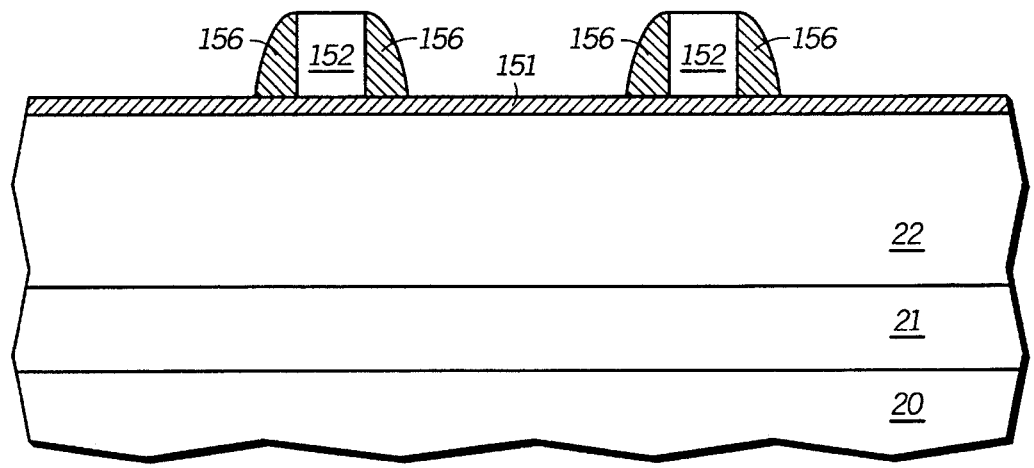
FIG. 15 includes an illustration of a cross-sectional view of a portion of a semiconductor substrate after forming portions of floating gates, spacers, and source and drain regions.

Still another embodiment of the present invention uses chemical-mechanical polishing to form floating gates. The starting point of this process is a substrate as substantially shown in FIGS. 2 and 3 except that trench field isolation regions are used in this embodiment. A gate dielectric layer 151 is formed over the p-well region 22 as shown in FIG. 15. The trunk portions 152 of the floating gates are then formed by depositing a silicon or metal-containing layer to a thickness in a range of 500–5000 angstroms. After depositing the layer, it is patterned to form the trunk portions 152 as shown in FIG. 15. The width of the trunk portions 152 is typically no more than about 0.3 micron and may be a sublithographic dimension.

Figure 16:
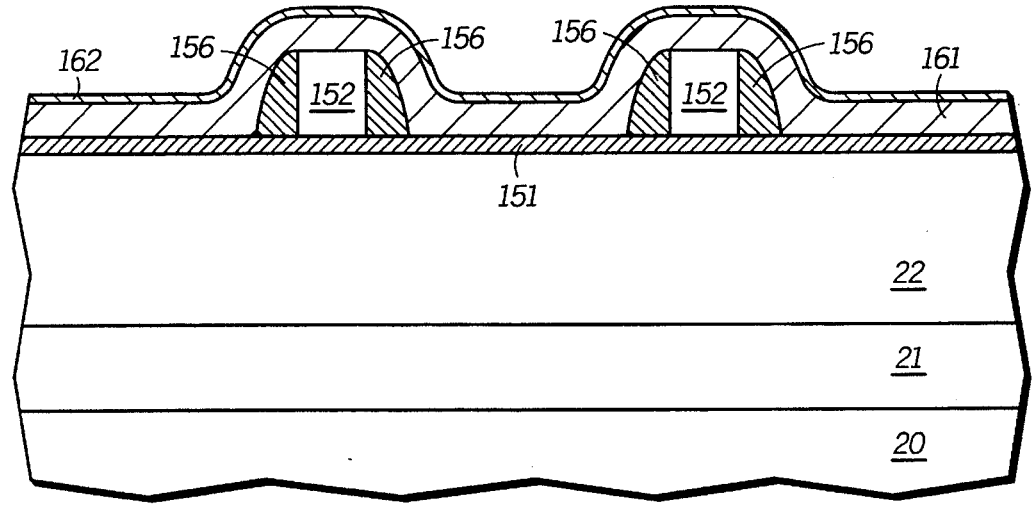
FIG. 16 includes an illustration of a cross-sectional view of the substrate of FIG. 15 after forming an oxide layer over the portions of the floating gates and spacers.

After forming the trunk portions 152, silicon nitride spacers 156 are then formed by depositing a silicon nitride layer and anisotropically etching it back. The thickness of the layer used to form the spacers 156 is typically in a range of 1000–2000 angstroms. A conformal insulating layer 161 is formed to a thickness in a range of 300–3000 angstroms as shown in FIG. 16. Typically, layer 161 includes oxide. In one embodiment, heavily doped oxide may be used for layer 161, so that layer 161 may be wet chemically etched during a subsequent step without greatly affecting the trench field isolation regions. A polish-stop layer 162 is formed over the layer 161. The polish-stop layer 162 may include nitride, such as silicon nitride, boron nitride, and the like, and may have a thickness in a range of about 200–1000 angstroms. The total thickness of the layers 161 and 162 will be the approximate height of the trunk portions 152 after polishing.

Figure 17:
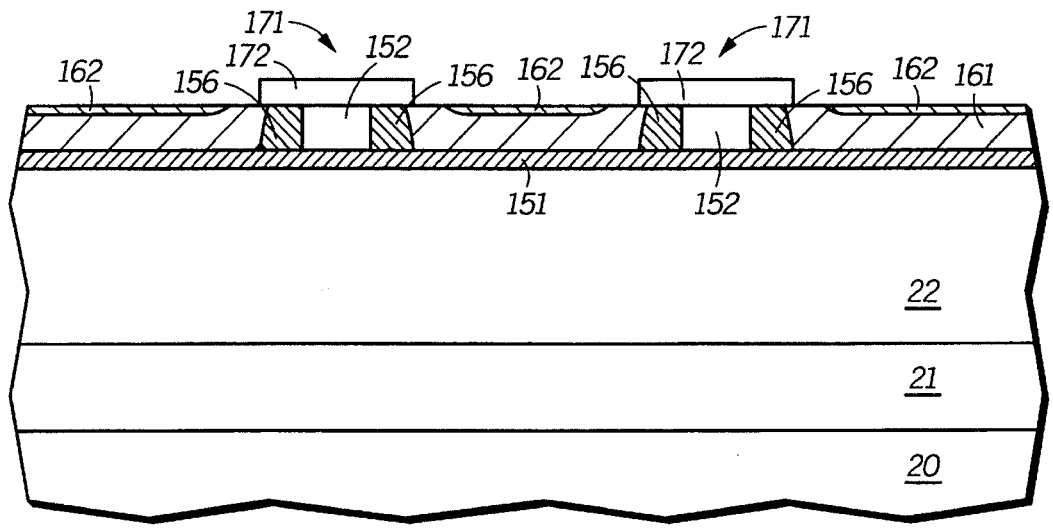
FIG. 17 and 18 include illustrations of cross-sectional views of the substrate of FIG. 16 after completing the formation of the floating gates.
Figure 18:
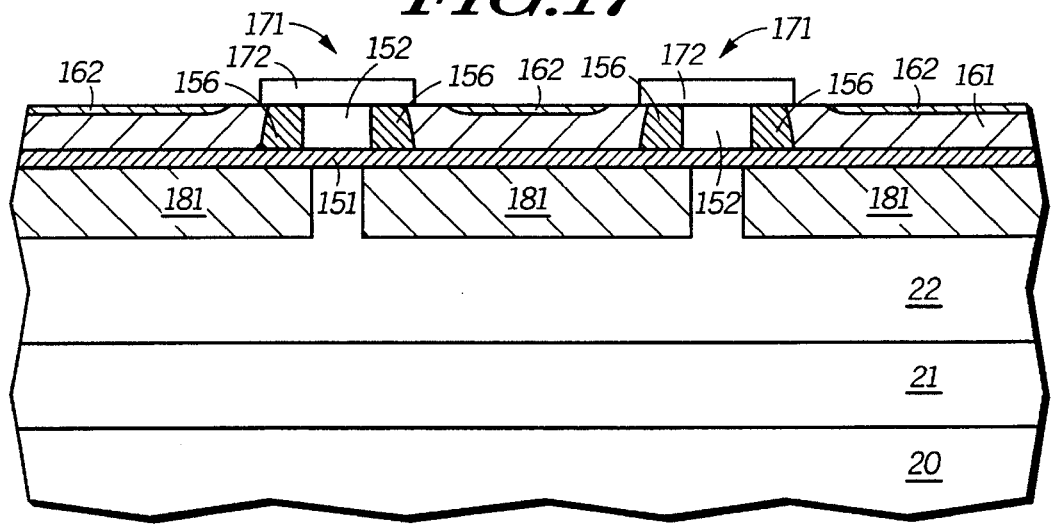

The substrate is then chemical-mechanical polished to reduce the height of the trunk portions 152 to a height in a range of 500–2000 angstroms. Cross bar portions 172 are then formed over the trunk portions 152 as shown in FIG. 17 and 18. The combination of the trunk portions 152 and cross bar portions 172 form the floating gates 171. The widths of the cross bar portions 172 as shown in FIG. 17 are in a range of about 0.5–1.0 micron. FIG. 18 includes an illustration of a cross-sectional view of the substrate at the this point in processing and is along a plane substantially perpendicular to the plane as shown in FIG. 17. The trunk portions 152 of the floating gates 171 extend completely across portions of the well region 22 that lie between the trench field isolation regions 181. The cross bar portions 172 are not a single continuous strip but are discreet portions. This allows separate memory cells to be formed.

The location of the cross-sectional view of FIGS. 15–17 is similar to a location at the sectioning lines 4—4 of FIG. 3. Regions 31 of FIG. 3 would be replaced by regions 181. The trench field isolation regions 181 are not seen in FIGS. 15–17 because these figures are along the length of an active region.

The layers 161 and 162, spacers 156, and portions of the gate dielectric layer 151 that are not covered by the trunk portions 152 are then removed after the floating gates 171 are formed. If layer 161 includes a doped oxide, it should etch at a substantially faster rate than the trench field isolation regions that may underlie it. If layer 161 includes about four weight percent phosphorus that has been densified, layer 161 should etch about 5–10 times faster than the trench field isolation regions 181 when a wet chemical oxide etchant, such as hydrofluoric acid and the like, is used. If layer 161 includes about four weight percent phosphorus that has not been densified, layer 161 should etch more than 10 times faster than the trench field isolation regions 181. Therefore, the layer 161 may be removed without substantially affecting the trench field isolation regions 181.

Figure 19:
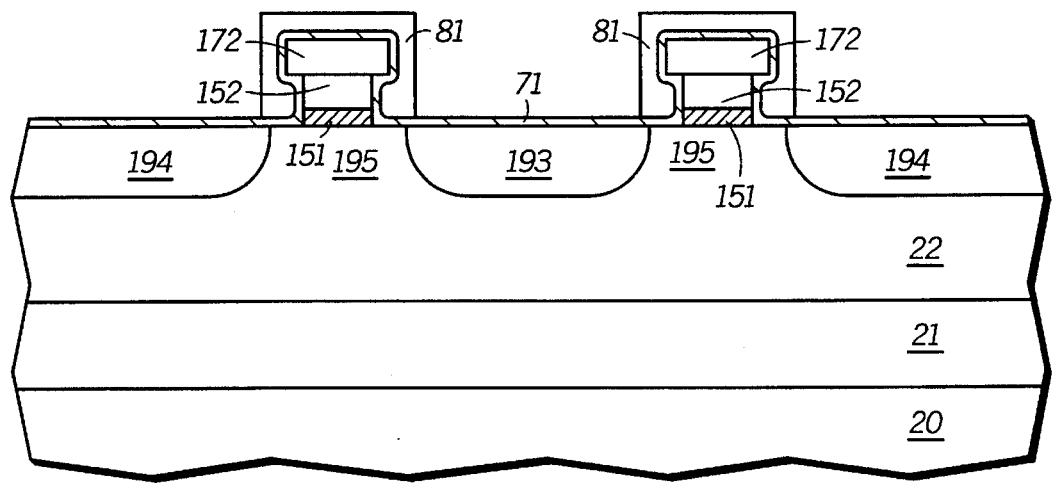
FIG. 19 includes an illustration of a cross-sectional view of the substrate of FIGS. 17 and 18 after forming word lines.

An intergate dielectric layer 71, word lines 81, source region 193, and drain regions 194 are formed as shown in FIG. 19. The formation of the intergate dielectric layer 71, word lines 81, source region 193, and drain regions 194 are formed in a manner similar to that described previously for a previous embodiment. The portions of the well region 22 that lie between the trench field isolation regions 181, source regions 193, and drain regions 194 are the channel regions 195.

The memory cells as shown in FIG. 19 are further processed in accordance with an earlier embodiment to form a substantially completed device. The memory cells will be programmed and erased by Fowler-Nordheim tunneling and will have programming, erasing, and reading characteristics similar to those previously discussed for the flash EEPROM embodiment.

Hybrids

Portions of some embodiments previously described may be mixed or matched with portions of other embodiments previously described. Below is a list of alternative configurations that are not meant to limit but merely illustrate options available. In a first option, an IEEPROM array may have both the graded drain regions and the plurality of p-well regions.

If a device is going to be used in a computer or other electronic component that has a limited power supply, such as a battery, the memory cells may be programmed or erased by Fowler-Nordheim tunneling because programming using Fowler-Nordheim tunneling consumes less energy compared to hot electron injection. On the other hand, if energy consumption is not as much of a concern but programming speed is important, hot electron injection may be used. If Fowler-Nordheim tunneling is used, a page write method of programming cells may be used. Hot carrier injection may be used to program the memory cells, although some steps in forming the memory cells may need to be modified.

Various configurations of the p-well regions allow a number of different types of erasing to be used. To form flash EEPROM cells, all memory cells lying along a single word line 81 may lie within the same p-well region, such as p-well region 22. For IEEPROM cells, each memory cell along a word line 81 may lie within different p-well regions, such as p-well regions 122. For another type of IEEPROM cells, each memory cell may have a graded drain region 144 that allows erasing to occur only at the memory cell where the word line 81 and graded drain region 144 that are properly enabled. Note that the polishing embodiment may also using the various configurations to make IEEPROM cells.

All of the previously described embodiments may be used to form EPROM cells. More specifically, if a memory cell is a one time programmable (OTP) EPROM, a memory cell is either never programmed or is programmed once. If an ultraviolet ray erasable (UV) EPROM is to formed, the memory cells may be programming using any of the methods described above, erased by exposing the memory cells to ultraviolet rays, and reprogrammed.

Benefits

The embodiments include memory cells that have relatively high capacitive coupling between the floating gates and the word lines that act as control gates. This high capacitive coupling helps to reduce the programming and erase voltages. The memory cells may be used on a device having a single power supply voltage, such as VDD. Because the memory cells may be programmed by tunneling, programming and erasing currents are relatively low (compared to hot carrier injection). Therefore, a charge pump may be used to achieve higher voltages, if needed.

Also, the embodiments may form sublithographic tunneling windows. The efficiency of programming and erasing and reliability of the memory cells may be improved by the sublithographic tunneling windows. The smaller area means an increased electrical field near the tunneling window. Also, the small tunneling window reduces the chances that holes will be injected into the gate (tunnel) dielectric layer during programming or erasing. The tunneling window may have an area in a range of about 0.01–0.10 square microns. Clearly, smaller windows are possible as improvements in lithography are made.

In addition, the memory cells have merged select/control gates which form memory cells that have virtually no chance of forming over erased cells during an erasing operation. Therefore, one does not need to use a repair operation to repair the over erased cells. Further, the merged select/control gates typically occupy less area than separate select gates and control gates.

In addition, one skilled in the art can determine how the memory cells are to be programmed and erased and design the p-well regions, source regions, and drain regions accordingly. Therefore, the memory array may be tailored more specifically to the needs of the user of the memory array.

Memory cells of the present invention should not have any disturb problems that may occur during a programming, erasing, or reading operation. A further advantage of the present invention is that the memory cells are relative scalable and can be shrunk in both vertically and horizontally as technology progresses.

In the foregoing specification, the invention has been described with reference to specific embodiments thereof. However, it will be evident that various modifications and changes can be made thereto without departing from the broader spirit or scope of the invention as set forth in the appended claims. Specific numbers for thicknesses, widths, potentials, and the like have been presented. These numbers are only meant to illustrate and not limit the invention. Accordingly, the specification and drawings are to be regarded in an illustrative rather than a restrictive sense.

What is claimed is:

1. A process for forming an electrically programmable read-only memory cell comprising the steps of:
   forming a first layer over a semiconductor substrate;
   forming an opening through the first layer;
   forming a spacer adjacent to the opening in the first layer;
   forming a floating gate overlying the substrate, wherein the floating gate has a T-shape and is formed after the step of forming the spacer;
   removing the first layer and spacer after the step of forming the floating gate; forming an intergate dielectric layer lying adjacent to the floating gate, wherein the intergate dielectric layer has a uniform thickness adjacent to the floating gate; and
   forming a control gate lying adjacent to the intergate dielectric layer, wherein a portion of the control gate underlies a portion of the floating gate.

2. The process of claim 1, wherein the step of forming the intergate dielectric layer is performed such that the intergate dielectric layer includes oxide-nitride-oxide and has an electrically measured oxide equivalent thickness in a range of 50–300 angstroms.

3. The process of claim 1, further comprising steps of:
   forming a tunnel dielectric layer having a thickness in a range of 50–150 angstroms before the step of forming the floating gate; and
   forming a first doped region and a second doped region, wherein:
      the first and second doped regions lie within the substrate and define a channel region; and
      at least a portion of the channel region underlies the floating gate.

4. The process of claim 1, wherein the control gate is also a select gate for the memory cell.

5. A process for forming a semiconductor device including a first plurality of electrically programmable read-only memory cells comprising the steps of:
   forming a first well region having a first conductivity type within a semiconductor substrate having a second conductivity type that is opposite the first conductivity type;
   forming a second well region having the second conductivity type within the first well region;
   forming floating gates, wherein:
      a first plurality of floating gates are formed over the substrate;
      a second plurality of floating gates are formed over the first well region; and
      a third plurality of floating gates are formed over the second well region;
   forming an intergate dielectric layer lying adjacent the floating gates; and
   forming word lines lying adjacent to the intergate dielectric layer.

6. The process of claim 5, wherein:
   the step of forming the second well region is performed such that at least one other second well region is formed, wherein:

the at least one other second well region has the second conductivity type;

the at least one other second well region lies within the first well region; and the second well regions are spaced apart from each other; and the step of forming the floating gates is performed such that a fourth plurality of floating gates are formed over the at least one other second well region.

7. The process of claim 6, wherein the step of forming the floating gates is performed such that the second plurality is equal to the sum of the third and fourth pluralities.

8. The process of claim 5, wherein:

the step of forming the floating gates is performed such that each of the floating gates has a T-shape that includes a trunk portion and a cross-bar portion;

the step of forming the intergate dielectric layer is performed such that the intergate dielectric layer has a uniform thickness along surfaces of the trunk and cross-bar portions of the floating gates; and the step of forming the word lines is performed such that the word lines lie adjacent to the intergate dielectric layer, wherein portions of the word lines underlie portions of the floating gates.

9. The process of claim 5, wherein the step of forming the intergate dielectric layer is performed such that the intergate dielectric layer includes oxide-nitride-oxide and has an electrically measured oxide equivalent thickness in a range of 50–300 angstroms.

10. The process of claim 1 further comprising a step of forming a gate dielectric layer underlying the opening after the step of forming the spacer, wherein the step of forming the floating gate comprises steps of:

forming a silicon layer within the opening, adjacent to the spacer, and over the first layer; and patterning the silicon layer to form the floating gate.

11. A process for forming an electrically programmable read-only memory cell comprising the steps of:

forming a gate dielectric layer over a semiconductor substrate;

forming a floating gate over the gate dielectric layer, wherein the step of forming the floating gate comprises steps of:

forming a first silicon layer over the gate dielectric layer;

patterning the first silicon layer to form a first silicon member;

forming spacers adjacent to the first silicon member;

forming a first layer over the substrate, wherein the spacers and the first layer include different materials;

polishing the first silicon member to form a trunk portion of the floating gate, wherein the trunk portion has a trunk width;

forming a second silicon member over the trunk portion to form the floating gate, wherein:

the second silicon member is a cross-bar portion of the floating gate; and the cross-bar portion has a cross-bar width that is wider than the trunk width;

forming an intergate dielectric layer lying adjacent to the floating gate, wherein the intergate dielectric layer has a uniform thickness adjacent to the floating gate; and forming a control gate lying adjacent to the intergate dielectric layer, wherein a portion of the control gate underlies a portion of the floating gate.

12. The process of claim 11, wherein:

the step of forming the gate dielectric layer forms a tunnel dielectric layer having a thickness in a range of 50–150 angstroms; and the step of forming the intergate dielectric layer is performed such that the intergate dielectric layer includes oxide-nitride-oxide and has an electrically measured oxide equivalent thickness in a range of 50–300 angstroms.

13. The process of claim 11, wherein:

the process further comprises a step of forming a first doped region and a second doped region, wherein:

the first and second doped regions lie within the substrate and define a channel region; and at least a portion of the channel region underlies the floating gate; and the control gate is also a select gate for the memory cell.

14. The process of claim 11, wherein the process further comprising steps of:

forming a first layer over the substrate;

forming an opening through the first layer before forming the gate dielectric layer; and removing the first layer and spacer after the step of forming the floating gate.

15. A process for forming an electrically programmable read-only memory cell comprising the steps of:

forming a gate dielectric layer over a semiconductor substrate;

forming a floating gate on the gate dielectric layer, wherein the floating gate has a T-shape with a wide portion and a narrow portion that lies on the gate dielectric layer;

forming an intergate dielectric layer lying adjacent to the floating gate, wherein the intergate dielectric layer has a uniform thickness adjacent to the floating gate; and forming a control gate lying adjacent to the intergate dielectric layer, wherein a portion of the control gate underlies a portion of the floating gate.

16. The process of claim 15, wherein the step of forming the intergate dielectric layer is performed such that the intergate dielectric layer includes oxide-nitride-oxide and has an electrically measured oxide equivalent thickness in a range of 50–300 angstroms.

17. The process of claim 15, wherein the step of forming the gate dielectric layer forms a tunnel dielectric layer having a thickness in a range of 50–150 angstroms.

18. The process of claim 15, further comprising a step of forming a first doped region and a second doped region, wherein:

the first and second doped regions lie within the substrate and define a channel region; and at least a portion of the channel region underlies the floating gate.

19. The process of claim 15, wherein the step of forming the floating gate comprises steps of:

forming a first silicon layer on the gate dielectric layer;

patterning the first silicon layer to form a first silicon member;

forming spacers adjacent to the first silicon member;

forming a first layer over the substrate, wherein the spacers and the first layer include different materials;

polishing the first silicon member to form a trunk portion of the floating gate, wherein the trunk portion has a trunk width; and forming a second silicon member over the trunk portion to form the floating gate, wherein:
the second silicon member is a cross-bar portion of the floating gate; and
the cross-bar portion has a cross-bar width that is wider than the trunk width.

20. The process of claim 15, wherein the control gate is also a select gate for the memory cell.

21. The process of claim 15, further comprising steps of:
forming a first layer over the substrate;
forming an opening through the first layer;
forming a spacer adjacent to the opening in the first layer before the step of forming the floating gate; and
removing the first layer and spacer after the step of forming the floating gate.

22. The process of claim 21, wherein:

the step of forming the gate dielectric layer is performed after the step of forming the spacer; and the step of forming the floating gate comprises steps of:
forming a silicon layer within the opening, adjacent to the spacer, and over the first layer; and
patterning the silicon layer to form the floating gate.

* * * * *